(12) United States Patent
Choi

(10) Patent No.: US 11,552,009 B2
(45) Date of Patent: Jan. 10, 2023

(54) PRINTED CIRCUIT BOARD

(71) Applicant: SAMSUNG ELECTRO-MECHANICS CO., LTD., Suwon-si (KR)

(72) Inventor: Seong Ho Choi, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/180,101

(22) Filed: Feb. 19, 2021

(65) Prior Publication Data
US 2022/0165649 A1 May 26, 2022

(30) Foreign Application Priority Data
Nov. 23, 2020 (KR) .................. 10-2020-0157485

(51) Int. Cl.
*H05K 1/11* (2006.01)
*H01L 23/498* (2006.01)
*H01L 21/48* (2006.01)

(52) U.S. Cl.
CPC ...... *H01L 23/49822* (2013.01); *H01L 21/481* (2013.01); *H01L 21/4857* (2013.01); *H01L 23/49838* (2013.01); *H05K 1/111* (2013.01); *H05K 1/112* (2013.01); *H05K 1/115* (2013.01)

(58) Field of Classification Search
CPC ............ H01L 23/49822; H01L 21/481; H01L 21/4857; H01L 23/49838
See application file for complete search history.

(56) References Cited

U.S. PATENT DOCUMENTS

| | | | | |
|---|---|---|---|---|
| 8,299,368 B2* | 10/2012 | Endo | .................. | H05K 3/4007 |
| | | | | 257/737 |
| 9,485,864 B2* | 11/2016 | Imafuji | ................ | H05K 3/4007 |
| 9,867,296 B2* | 1/2018 | Kim | ........................ | H01L 25/50 |
| 10,602,621 B1* | 3/2020 | Hu | ........................ | H05K 3/423 |
| 10,833,002 B2* | 11/2020 | Kim | ................. | H01L 23/49827 |
| 2011/0051386 A1* | 3/2011 | Nagasawa | ......... | H01L 23/49827 |
| | | | | 174/262 |
| 2015/0092356 A1 | 4/2015 | Yoshikawa et al. | | |
| 2015/0092357 A1* | 4/2015 | Yoshikawa | ............ | H05K 1/113 |
| | | | | 216/13 |
| 2015/0250054 A1* | 9/2015 | Yoshikawa | ........... | H01L 25/105 |
| | | | | 361/767 |
| 2016/0268188 A1* | 9/2016 | Kariya | ................ | H01L 23/3121 |

FOREIGN PATENT DOCUMENTS

| | | |
|---|---|---|
| JP | 2015-072983 A | 4/2015 |
| JP | 2015-072984 A | 4/2015 |
| KR | 10-2159547 B1 | 9/2020 |

* cited by examiner

*Primary Examiner* — Ishwarbhai B Patel
(74) *Attorney, Agent, or Firm* — Morgan, Lewis & Bockius LLP

(57) ABSTRACT

A printed circuit board includes: a first insulating layer; a first wiring layer disposed on one surface of the first insulating layer; and a bump at least partially disposed in the first insulating layer and connected to the first wiring layer. The bump at least partially protrudes from the other surface of the first insulating layer, opposite to the one surface of the first insulating layer.

5 Claims, 6 Drawing Sheets

PRINTED CIRCUIT BOARD

CROSS-REFERENCE TO RELATED APPLICATION(S)

This application claims benefit of priority to Korean Patent Application No. 10-2020-0157485 filed on Nov. 23, 2020 in the Korean Intellectual Property Office, the disclosure of which is incorporated herein by reference in its entirety.

TECHNICAL FIELD

The present disclosure relates to a printed circuit board.

BACKGROUND

Currently, a soldering technique in which solder balls are disposed to bond a printed circuit board and an integrated circuit (IC) chip to each other is widely used. However, when such solder balls are used, currently there may be problems in that fine-size openings should be formed in a solder resist, a pad on the outermost layer and the solder resist should be exactly matched, and a short circuit between the respective solder balls may occur. Thus, solutions to the problems are required.

SUMMARY

An aspect of the present disclosure may provide a printed circuit board on which an electrical connection metal component is disposed in the form of a metal bump.

Another aspect of the present disclosure may provide a printed circuit board including a metal bump partially buried in an insulating layer and partially protruding from the insulating layer.

Another aspect of the present disclosure may provide a printed circuit board including a metal bump including a plurality of plating layers.

According to an aspect of the present disclosure, a printed circuit board may include: a first insulating layer; a first wiring layer disposed on one surface of the first insulating layer; and a bump at least partially disposed in the first insulating layer and connected to the first wiring layer. The bump may at least partially protrude from the other surface of the first insulating layer, opposite to the one surface of the first insulating layer.

According to another aspect of the present disclosure, a printed circuit board may include: a plurality of wiring layers disposed on or between a plurality of insulating layers; a plurality of via layers connecting the plurality of wiring layers to each other; and a bump integrally connected to at least one of the plurality of wiring layers. The bump may include a first layer and a second layer disposed on a side surface of the first layer to surround the first layer.

According to another aspect of the present disclosure, a printed circuit board may include: a first insulating layer; a first wiring layer disposed on an upper surface of the first insulating layer; and a bump connected to the first wiring layer and protruding from a lower surface of the first insulating layer. The lower surface of the first insulating layer may have a higher roughness than the upper surface.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

In the present disclosure, the expression "side portion", "side surface", or the like is used to refer to a left or right direction or a surface in that direction based on the drawings for convenience, the expression "upper side", "upper portion", "upper surface", or the like is used to refer to an upward direction or a surface in that direction based on the drawings for convenience, and the expression "lower side", "lower portion", "lower surface", or the like is used to refer to a downward direction or a surface in that direction based on the drawings for convenience. In addition, the expression "positioned on the side portion, the upper side, the upper portion, the lower side, or the lower portion" conceptually includes a case in which a target component is positioned in a corresponding direction but is not in direct contact with a reference component, as well as a case in which the target component is in direct contact with the reference component in the corresponding direction. However, these directions are defined for convenience of explanation, and the claims are not particularly limited by the directions defined above, and the concepts of the upper and lower portions, sides and surfaces may be changed.

Figure 1:
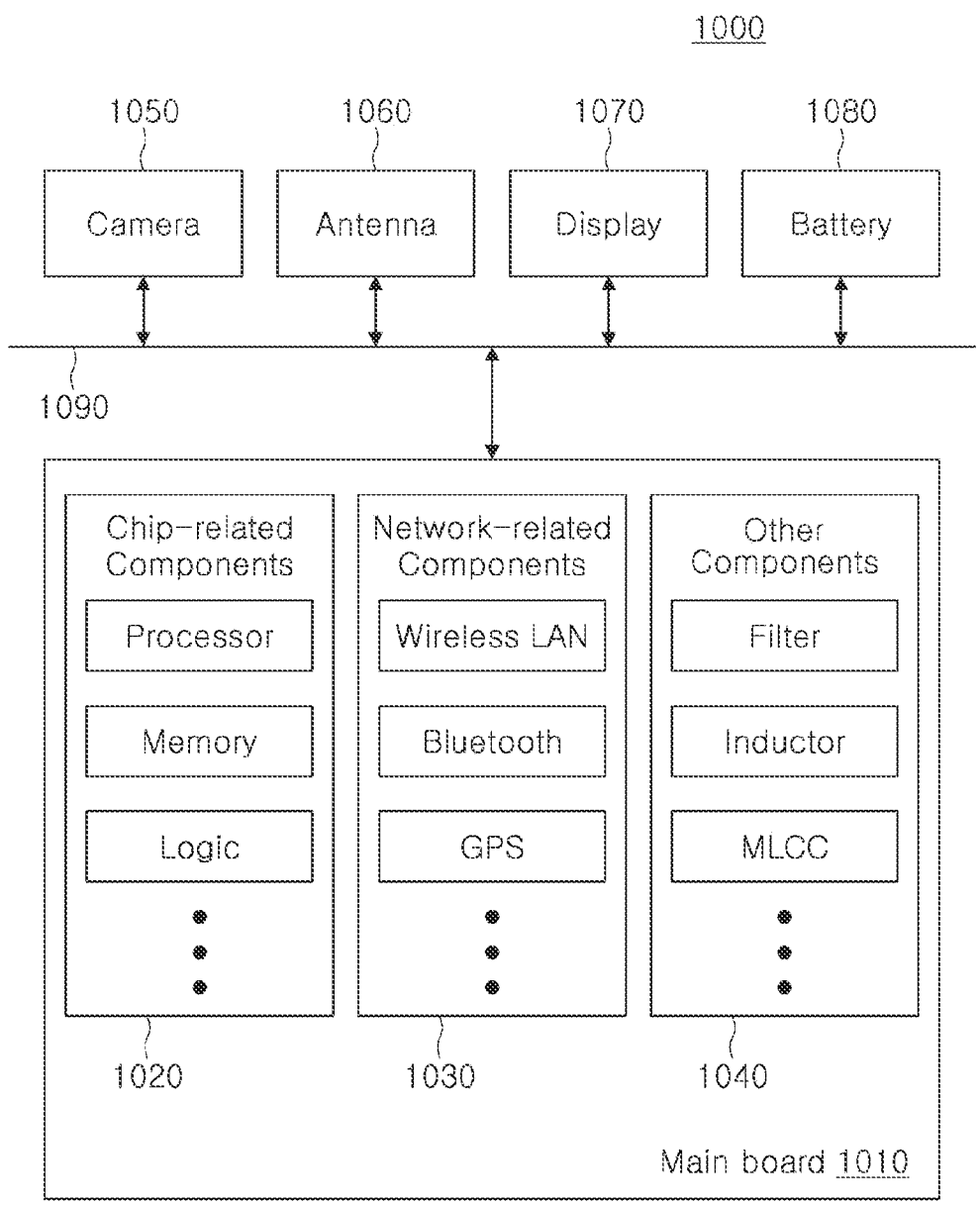
FIG. 1 is a block diagram schematically illustrating an example of an electronic device system.

FIG. 1 is a block diagram schematically illustrating an example of an electronic device system.

Referring to FIG. 1, an electronic device 1000 may accommodate a main board 1010 therein. Chip-related components 1020, network-related components 1030, and other components 1040 may be physically and/or electrically connected to the main board 1010. These components may also be coupled to other electronic components, which will be described later, to form various signal lines 1090.

The chip-related components 1020 may include: a memory chip such as a volatile memory (e.g. a dynamic random access memory (DRAM)), a non-volatile memory (e.g. a read only memory (ROM)), or a flash memory; an application processor chip such as a central processor (e.g. a central processing unit (CPU)), a graphics processor (e.g. a graphics processing unit (GPU)), a digital signal processor, a cryptography processor, a microprocessor, or a microcontroller; and a logic chip such as an analog-to-digital converter or an application-specific integrated circuit (ASIC). However, the chip-related components 1020 are not limited thereto, and may include any other types of chip-related components. Also, these chip-related components may also be combined with each other. The chip-related component may be in the form of a package including the above-described chip.

The network-related components 1030 may include wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+ (HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G, and any other wireless and wired protocols designated thereafter. However, the network-related components 1030 are not limited thereto, and may include any other wireless or wired standards or protocols. Also, the network-related component 1030 may be provided in the form of a package in combination with the chip-related component 1020.

The other components 1040 may include a high-frequency inductor, a ferrite inductor, a power inductor, ferrite beads, low-temperature co-firing ceramics (LTCC), an electro-magnetic interference (EMI) filter, a multi-layer ceramic condenser (MLCC), and the like. However, the other components 1040 are not limited thereto, and may include passive elements in the form of chip components used for various other purposes. Also, the other component 1040 may be provided in the form of a package in combination with the chip-related component 1020 and/or the network-related component 1030.

The electronic device 1000 may include any other electronic components that may be or may not be physically and/or electrically connected to the main board 1010 according to the type of electronic device 1000. Examples of the other electronic components may include a camera 1050, an antenna 1060, a display 1070, and a battery 1080. However, the other electronic components are not limited thereto, and may be an audio codec, a video codec, a power amplifier, a compass, an accelerometer, a gyroscope, a speaker, a mass storage device (e.g. a hard disk drive), a compact disc (CD), and a digital versatile disc (DVD). Also, the electronic device 1000 may include any other electronic components used for various purposes according to the type of electronic device 1000.

The electronic device 1000 may be a smartphone, a personal digital assistant, a digital video camera, a digital still camera, a network system, a computer, a monitor, a tablet, a laptop, a netbook, a television, a video game machine, a smart watch, or an automotive component. However, the electronic device 1000 is not limited thereto, and may be any other electronic device processing data.

Figure 2:
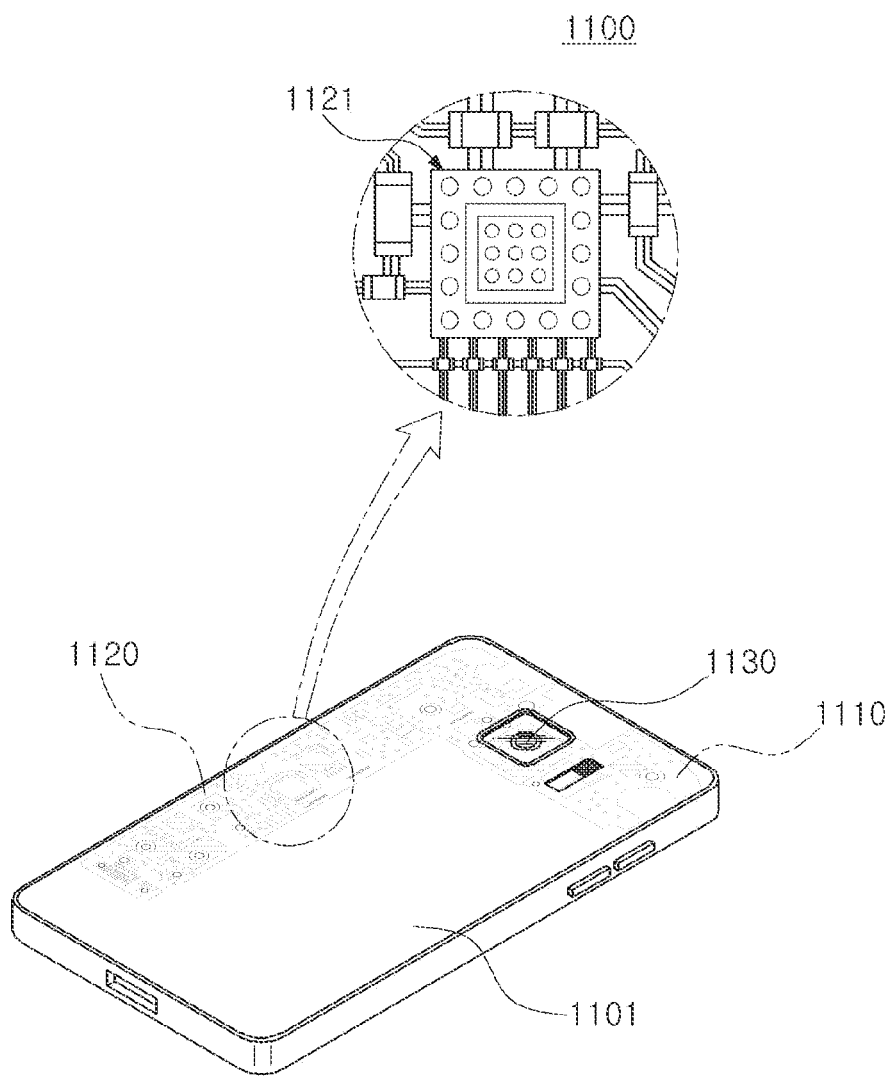
FIG. 2 is a perspective view schematically illustrating an example of an electronic device.

FIG. 2 is a perspective view schematically illustrating an example of an electronic device.

Referring to FIG. 2, the electronic device may be, for example, a smartphone 1100. A mother board 1110 may be accommodated in the smartphone 1100, and various electronic components 1120 may be physically and/or electrically connected to the motherboard 1110. Also, a camera 1130 and/or a speaker and the like may be accommodated in the smartphone 1100. Some of the electronic components 1120 may be the above-described chip-related components, for example, electronic component-embedded substrates 1121, but are not limited thereto. The electronic component-embedded substrate 1121 may be in a type in which an electronic component is embedded in a multilayer printed circuit board, but is not limited thereto. Meanwhile, the electronic device is not necessarily limited to the smartphone 1100, and may be another electronic device as described above.

Figure 3:
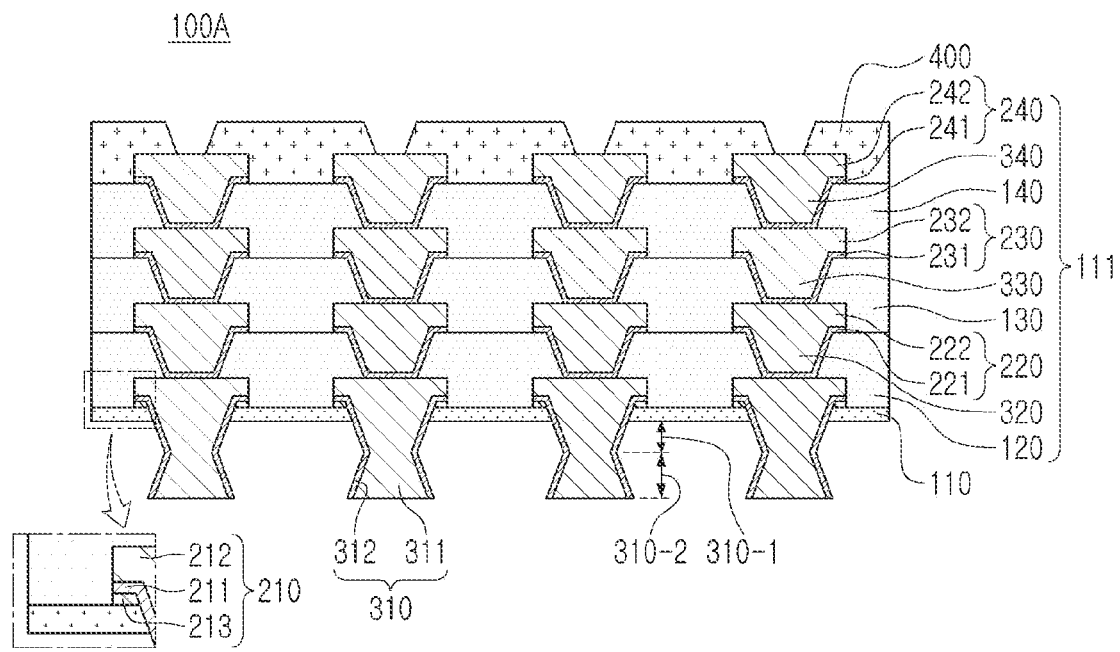
FIG. 3 is a cross-sectional view schematically illustrating an exemplary embodiment of a printed circuit board.

FIG. 3 is a cross-sectional view schematically illustrating an exemplary embodiment of a printed circuit board.

Referring to FIG. 3, the printed circuit board 100A according to an exemplary embodiment may include: a first insulating layer 110; a first wiring layer 210 disposed on the first insulating layer 110 and including a metal layer 213, a first seed layer 211, and a first electrolytic plating layer 212; a metal bump 310 penetrating through the first insulating layer 110 and connected to the first wiring layer 210; a build-up structure disposed on the first insulating layer 110 and including a plurality of insulating layers, a plurality of wiring layers, and a plurality of via layers; and a solder resist layer 400 disposed on the build-up structure to at least partially expose the outermost wiring layer.

Meanwhile, the build-up structure may include: a second insulating layer 120 disposed on the first insulating layer 110 and covering the first wiring layer 210; a second wiring layer 220 disposed on the second insulating layer 120 and including a second seed layer 221 and a second electrolytic plating layer 222; a second via layer 320 penetrating through the second insulating layer 120 and connecting the first wiring layer 210 to the second wiring layer 220; a third insulating layer 130 disposed on the second insulating layer 120 and covering the second wiring layer 220; a third wiring layer 230 disposed on the third insulating layer 130 and including a third seed layer 231 and a third electrolytic plating layer 232; a third via layer 330 penetrating through the third insulating layer 130 and connecting the second wiring layer 220 to the third wiring layer 230; a fourth insulating layer 140 disposed on the third insulating layer 130 and covering the third wiring layer 230; a fourth wiring layer 240 disposed on the fourth insulating layer 140 and including a fourth seed layer 241 and a fourth electrolytic plating layer 242; and a fourth via layer 340 penetrating through the fourth insulating layer 140 and connecting the third wiring layer 230 to the fourth wiring layer 240.

For example, as in a process to be described later, the printed circuit board 100A according to an exemplary embodiment may include a metal bump 310 may at least partially protrude from the other surface of the first insulating layer 110. After a first via layer 310' is formed through a technique in which both sides of a base substrate 10 are processed, the metal bump 310 may be formed by removing an insulating material from around the first via layer 310', and thus, the metal bump 310 may have an hourglass shape. In other words, the metal bump 310 may be formed to have a width varying in a lamination direction of the printed circuit board 100A, specifically a width decreasing and increasing in the lamination direction of the printed circuit board 100A. Since the metal bump 310 is formed by processing both sides of the base substrate 10 as described above, the metal bump 310 having a desired height can be manufactured by adjusting a thickness of the base substrate 10. Furthermore, separate solder bumps for disposing solder balls can be eliminated from the substrate manufacturing process, and thus, the process can be simplified. In addition, the use of the metal bump 310 makes it possible to prevent a solder resist non-development defect resulting from fine openings formed in the solder resist and a solder resist misregistration defect.

Hereinafter, components of the printed circuit board 100A according to an exemplary embodiment will be described in more detail with reference to the drawings.

FIG. 3 is a cross-sectional view schematically illustrating an exemplary embodiment of a printed circuit board.

A build-up structure 111 may be stacked on the first insulating layer 110. The build-up structure 111 may provide various wiring paths to the printed circuit board 100A. The build-up structure 111 may be disposed on an upper surface of the first insulating layer 110. The build-up structure 111 may include a plurality of insulating layers 120, 130, and 140, a plurality of wiring layers 220, 230, and 240, and a plurality of via layers 320, 330, and 340.

The first insulating layer 110 may have a smaller thickness than each of the second to fourth insulating layers 120 to 140 of the build-up structure 111. This is because the first insulating layer 110 is formed by removing an insulating material 11 through blasting as in the process to be described later. The insulating material 11 of the base substrate 10 to be described later may function as a support substrate of the printed circuit board 100A in the process of manufacturing the printed circuit board 100A. In addition, the first insulating layer 110 may include one surface and the other surface, opposite to the one surface. The first wiring layer 210 may be disposed on the one surface of the first insulating layer 110, and the blasting to be described later may be performed on the other surface of the first insulating layer 110, and thus, the first insulating layer 110 may have a higher roughness on the other surface than on the one surface.

As the material of the first insulating layer 110, an insulating material may be used. The insulating material may be a thermosetting resin such as an epoxy resin or a thermoplastic resin such as polyimide. Also, the insulating material may be a thermosetting resin or a thermoplastic resin mixed with an inorganic filler such as silica and a reinforcing material such as glass fiber, e.g. prepreg, but is not limited thereto.

The first wiring layer 210 may be disposed on one surface of the first insulating layer 110. The first wiring layer 210 may include a metal layer 213, a first seed layer 211 disposed on the metal layer 213, and a first electrolytic plating layer 212 disposed on the first seed layer 211. When the base substrate 10 is formed of an insulating material 11 without a copper foil 12, the metal layer 213 of the first wiring layer 210 may be omitted. In this case, the first wiring layer 210 may include a first seed layer 211 and a first electrolytic plating layer 212 disposed on the first seed layer 211.

As a material of the first wiring layer 210, a metal material may be used. Here, the metal material may be copper (Cu), aluminum (Al), silver (Ag), tin (Sn), gold (Au), nickel (Ni), lead (Pb), titanium (Ti), or an alloy thereof. The first wiring layer 210 may perform various functions according to the design. For example, the first wiring layer 210 may include a ground pattern, a power pattern, a signal pattern, and the like. Each of these patterns may have a line, plane, or pad shape. The first wiring layer 210 may be formed by plating such as an additive process (AP), a semi-additive process (SAP), a modified semi-additive process (MSAP), or tenting (TT). As a result, the first wiring layer 210 may include a seed layer, which is an electroless plating layer, and an electrolytic plating layer, which is formed on the basis of the seed layer. When resin coated copper (RCC) is used for the second to fourth insulating layers 120 to 140, the first wiring layer 210 may further include a metal foil such as a copper foil on the lowermost side thereof, and if necessary, may further include a primer resin formed on a surface of the metal foil.

The bump 310 may be integrally connected to the first wiring layer 210 and include a first layer 311 and a second layer 312. In this case, the first layer 311 may be disposed on a side surface of the second layer 312 to surround the second layer 312. The bump 310 may have a width varying in one direction, as disclosed in FIG. 3. Here, the one direction is a build-up direction, a lamination direction, a thickness direction, or the like of the printed circuit board 100A.

In the printed circuit board 100A according to an exemplary embodiment, the bump 310 may have a width, diameter, or cross-sectional portion varying in the one direction. Specifically, the bump 310 may have a width, diameter, or cross-sectional portion decreasing and increasing in the one direction.

In addition, the bump 310 may be at least partially buried in the plurality of insulating layers and may at least partially protrude from the plurality of insulating layers in the printed circuit board 100A. Specifically, the bump 310 may at least partially protrude from the other surface of the first insulating layer 110. Based on this structure, the bump 310 may function to connect the printed circuit board 100A to an external component. In addition, the other portion of the bump 310 may be at least partially disposed in the first insulating layer 110. Referring to FIG. 3, the bump 310 may be at least partially disposed to penetrate through the first insulating layer 110.

Concerning the specific shape of the bump 310, the portion of the bump 310 protruding from the other surface of the first insulating layer 110 may include first and second portions 310-1 and 310-2. As described above, the bump 310 may have a width decreasing and increasing in one direction. Accordingly, based on a portion in which the width of the bump 310 is smallest, the first portion 310-1 may be an upper portion of the bump 310 and the second portion 310-2 may be a lower portion of the bump 310. Since only a portion of the insulating material 11 is removed during the formation of the bump 310 to be described later, the first insulating layer 110 may at least partially remain under the first wiring layer 210. Accordingly, in the bump 310 described above, the first portion 310-1 may have a smaller thickness than the second portion 310-2. In other words, the first portion 310-1 may have a smaller height than the second portion 310-2. As a result, in the portion of the bump 310 protruding from the other surface of the first insulating layer 110, the upper and lower portions may be asymmetric with respect to the portion in which the width of the bump 310 is smallest.

In the printed circuit board 100A according to the present disclosure, the bump 310 may be manufactured to omit a separate manufacturing step in which a dry film resist is used. The bump 310 may be disposed by forming the first via layer 310', which will be described later, and the structure of the bump 310 may be completed by removing the insulating material 11 around the first via layer 310'. Therefore, the first via layer 310' and the bump 310 may be used to indicate the same component, and may be used interchangeably in the detailed description of the present disclosure.

As a material of the bump 310, a metal material may be used. Here, the metal material may be copper (Cu), aluminum (Al), silver (Ag), tin (Sn), gold (Au), nickel (Ni), lead (Pb), titanium (Ti), or an alloy thereof. The bump 310 may be formed by completely filling each via hole with the metal material. The bump 310 may also be formed by plating such as AP, SAP, MSAP, or TT, and may include a first layer 311, which is a seed layer as an electroless plating layer, and a second layer 312, which is formed on the basis of the seed layer.

The second to fourth insulating layers 120 to 140 of the build-up structure 111 may or may not be formed of the same material as the first insulating layer 110. Specifically, as a material of the second to fourth insulating layers 120 to 140, an insulating material may be used. The insulating material may be a thermosetting resin such as an epoxy resin or a thermoplastic resin such as polyimide. Also, the insulating material may be a thermosetting resin or a thermoplastic resin mixed with an inorganic filler such as silica and a reinforcing material such as glass fiber, e.g. prepreg, but is not limited thereto. Meanwhile, although FIG. 3 illustrates that the build-up structure 111 includes three insulating layers, i.e. the second to fourth insulating layers 120 to 140, a larger number of insulating layers may be built up or a smaller number of insulating layers may be included in the build-up structure 111. The build-up structure 111 may be disposed on one surface of the first insulating layer 110, and the lowermost layer of the build-up structure 111, i.e. the second insulating layer 120, may be disposed to cover the first wiring layer 210. In addition, the third and fourth insulating layers 130 and 140 may be sequentially disposed on the second insulating layer 120. In the printed circuit board 100A according to an exemplary embodiment, each of the plurality of insulating layers of the build-up structure may have a greater thickness than the first insulating layer 110.

The second to fourth wiring layers 220 to 240 of the build-up structure 111 may be disposed on or between the second to fourth insulating layers 120 to 140 of the build-up structure 111. The second to fourth wiring layers 220 to 240 may include second to fourth seed layers 221 to 241 and second to fourth electrolytic plating layers 222 to 242, respectively. As a material of the second to fourth wiring layers 220 to 240, a metal material may be used. Here, the metal material may be copper (Cu), aluminum (Al), silver (Ag), tin (Sn), gold (Au), nickel (Ni), lead (Pb), titanium (Ti), or an alloy thereof. The second to fourth wiring layers 220 to 240 may perform various functions according to the designs. For example, the second to fourth wiring layers 220 to 240 may include a ground pattern, a power pattern, a signal pattern, and the like. Each of these patterns may have a line, plane, or pad shape. The second to fourth wiring layers 220 to 240 may be formed by plating such as an additive process (AP), a semi-additive process (SAP), a modified semi-additive process (MSAP), or tenting (TT). As a result, each of the second to fourth wiring layers 220 to 240 may include a seed layer, which is an electroless plating layer, and an electrolytic plating layer, which is formed on the basis of the seed layer. Meanwhile, although FIG. 3 illustrates that the build-up structure 111 includes three wiring layers, i.e. the second to fourth wiring layers 220 to 240, a larger number of wiring layers may be built up or a smaller number of wiring layers may be included in the build-up structure 111.

The outermost one of the plurality of wiring layers included in the build-up structure 111 may be at least partially exposed by the openings of the solder resist layer 400 disposed on the outermost layer. Thus, the outermost wiring layer of the build-up structure 111 may function as a pad for connection to another external component, and a gold plating layer or a surface treatment layer may be disposed on a surface of the outermost wiring layer of the build-up structure 111. Meanwhile, connection metals such as solder balls or bumps on which soldering has been performed may be disposed on the surface of the outermost wiring layer of the build-up structure 111.

The solder resist layer 400 may be a layer disposed on the build-up structure 111 described above to cover and protect the outermost wiring layer (the fourth wiring layer 240 in FIG. 3). The openings may be formed in the solder resist layer 400 to partially expose the outermost wiring layer (e.g. the fourth wiring layer 240). A portion of the outermost wiring layer exposed by the solder resist layer 400 may function as a pad and be connected to an external substrate or an external device.

The solder resist layer 400 may include a photosensitive material. The solder resist layer 400 may include a photo-curable resin. In this case, the openings of the solder resist layer 400 may be formed through a photolithography technique.

The second to fourth via layers 320 to 340 of the build-up structure 111 may be disposed to at least partially penetrate through the second to fourth insulating layers 120 to 140, respectively. Specifically, the second via layer 320 may penetrate through the second insulating layer 120 and connect the first and second wiring layers 210 and 220 to each other, the third via layer 330 may penetrate through the third insulating layer 130 and connect the second and third wiring layers 220 and 230 to each other, and the fourth via layer 340 may penetrate through the fourth insulating layer 140 and connect the third and fourth wiring layers 230 and 240 to each other. Although FIG. 3 illustrates that the build-up structure 111 includes three via layers, i.e. the second to fourth via layers 320 to 340, a larger number of via layers or a smaller number of via layers may be included in the build-up structure 111.

Although not illustrated, the outermost wiring layer exposed by the solder resist layer 400 may function as a pad for an external connection, and a solder ball, a solder bump, or the like may be additionally disposed on the pad as a connection member and electrically connected to another external component.

In addition, although not illustrated, the printed circuit board 100A according to an exemplary embodiment may further include an electronic component disposed on the metal bump 310 and electrically connected to the metal bump 310. The electronic component may be an integrated circuit (IC) die in which hundreds to millions of elements are integrated in a single chip. For example, the electronic component may be a processor chip, specifically an application processor (AP), such as a central processor (e.g. a central processing unit (CPU)), a graphics processor (e.g. a graphics processing unit (GPU)), a field programmable gate array (FPGA), a digital signal processor, a cryptography processor, a microprocessor, or a microcontroller, but is not limited thereto. In addition, the electronic component may be a memory, such as a volatile memory (e.g. a dynamic random access memory (DRAM)), a non-volatile memory (e.g. a read only memory (ROM)), or a flash memory, or a logic, such as an analog-to-digital converter or an application-specific integrated circuit (ASIC). If necessary, the electronic component may be a passive component in the form of a chip, e.g. an inductor in the form of a chip or a capacitor in the form of a chip. The electronic component may be disposed such that a surface on which the connection pad is disposed is directed upwardly, and the opposite surface thereof is directed downwardly. The connection pad of the electronic component may include a metal material such as copper (Cu) or aluminum (Al), and may be connected to the metal bump 310.

FIGS. 4 through 11 are cross-sectional views schematically illustrating an exemplary embodiment of a process of manufacturing the printed circuit board of FIG. 3.

Figure 4:
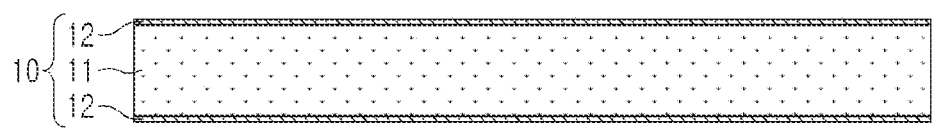
FIGS. 4 through 11 are cross-sectional views schematically illustrating an exemplary embodiment of a process of manufacturing the printed circuit board of FIG. 3.
Figure 5:
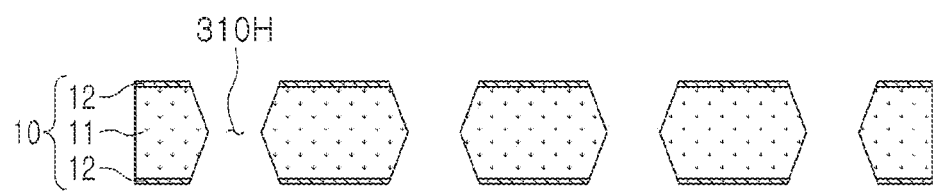

Referring to FIG. 4, first of all, a base substrate 10 having a copper foil 12 disposed on at least one surface thereof may be prepared. The base substrate 10 may be a copper clad laminate including an insulating material 11 and a copper foil 12, but is not limited thereto. The base substrate 10 may be formed of only the insulating material 11. Next, the base substrate 10 may be processed to form a via hole 310H penetrating therethrough. The via hole 310H may be formed by processing the base substrate 10 through double sided laser drilling (DSLD). Accordingly, the via hole 310H may have a width that gradually decreases and then gradually increases from one surface to the other surface of the base substrate 10 in a thickness direction of the base substrate 10, or may have an hourglass shape.

In addition, if appropriate, the via hole 310H may be formed by single sided laser drilling rather than the double side laser drilling. In this case, single sided laser drilling may be performed from one surface or the other surface of the base substrate 10 to the opposite surface. When the via hole 310H is formed by the single sided laser drilling, the via hole 310H may have a tapered shape, and accordingly, the via hole 310H may have a width that gradually decreases or increases from one side to the other side thereof or vice versa.

As a via hole processing technique, a general via hole processing technique, for example a laser processing technique using a $CO_2$ laser, a YAG laser, or the like, may be applicable, but the applicable via hole processing technique is not limited thereto.

Figure 6:
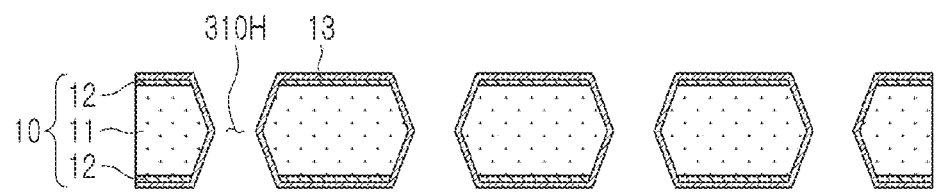

Referring to FIG. 6, a seed layer 13 may be formed, through an electroless plating or chemical copper plating technique, on the base substrate 10 processed such that the via hole 310H is formed therein. The seed layer 13 may be disposed on one surface and the other surface of the base substrate 10 and extend to be disposed on an inner wall of the via hole 310H.

Figure 7:
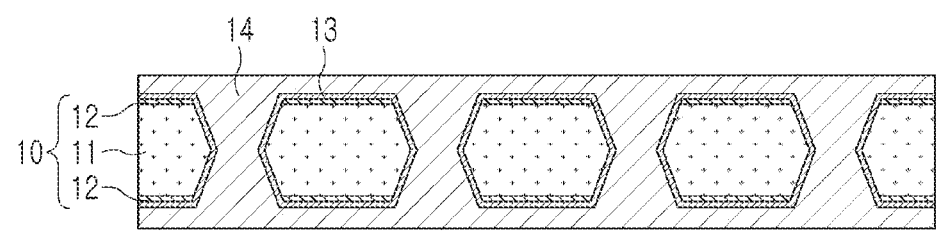

Referring to FIG. 7, an electrolytic plating layer 14 may be disposed on the electroless plating layer 13 by electrolytic plating. Through the electrolytic plating, the inner wall of the via hole 310H may be filled with the electrolytic plating layer 14. In this case, the electrolytic plating layer 14 filled in the via hole 310H may have various shapes according to the shape of the via hole 310H described above.

Figure 8:
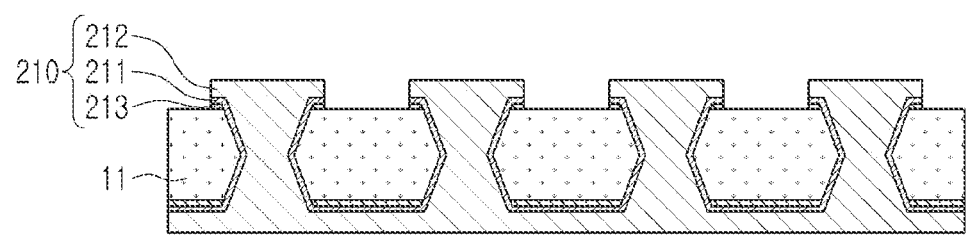

Referring to FIG. 8, a first wiring layer 210 may be formed by patterning the copper foil 12, the electroless plating layer 13, and the electrolytic plating layer 14 disposed on one surface of the base substrate 10 through a patterning technique. The first wiring layer 210 may include a metal layer 213, a first seed layer 211 disposed on the metal layer 213, and a first electrolytic plating layer 212 disposed on the first seed layer 211, which are patterned as described above. As the patterning technique, any general patterning technique may be applied without being limited. As an example of the patterning technique, patterning may be performed through exposure/development using a photosensitive resist.

Figure 9:
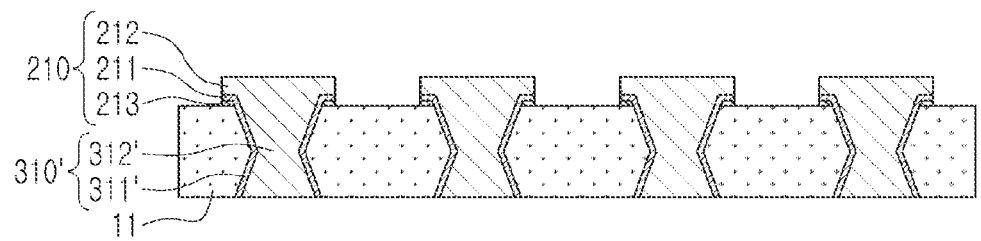

Referring to FIG. 9, a first via layer 310' may be formed by removing the seed layer 13 and the electrolytic plating layer 14 disposed on the other surface of the base substrate 10 through an etching or blasting technique. The first via layer 310' may include a plurality of plating layers 311' and 312' formed as a seed layer and an electrolytic plating layer. Meanwhile, as the etching technique, a general etching technique, such as wet or dry etching, may be used without being limited.

Figure 10:
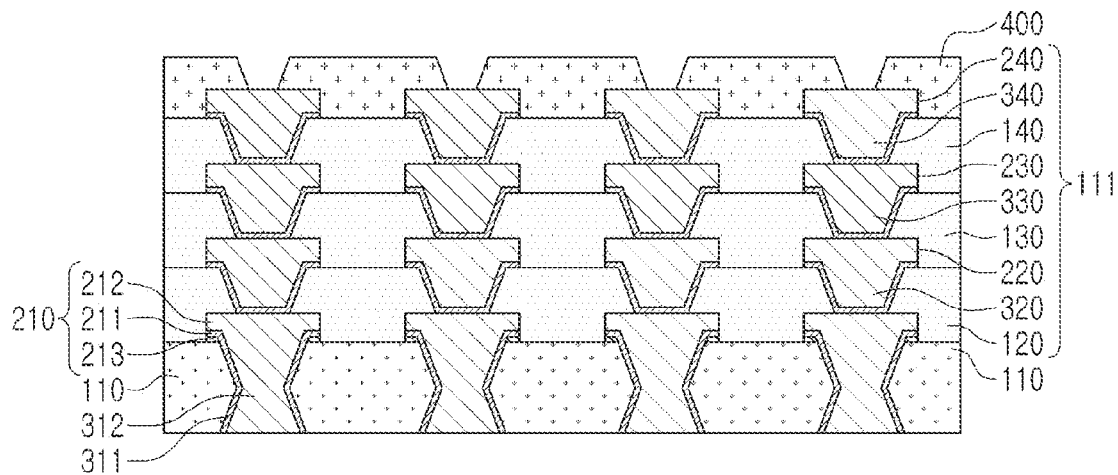

Referring to FIG. 10, a build-up structure 111 may be further disposed on the base substrate 10. The build-up structure 111 may be stacked on one surface of the base substrate 10, and include second to fourth insulating layers 120 to 140, second to fourth wiring layers 220 to 240, and second to fourth via layers 320 to 340. The second insulating layer 120 of the build-up structure 111 may be disposed to cover each of upper and side surfaces of the first wiring layer 210.

Figure 11:
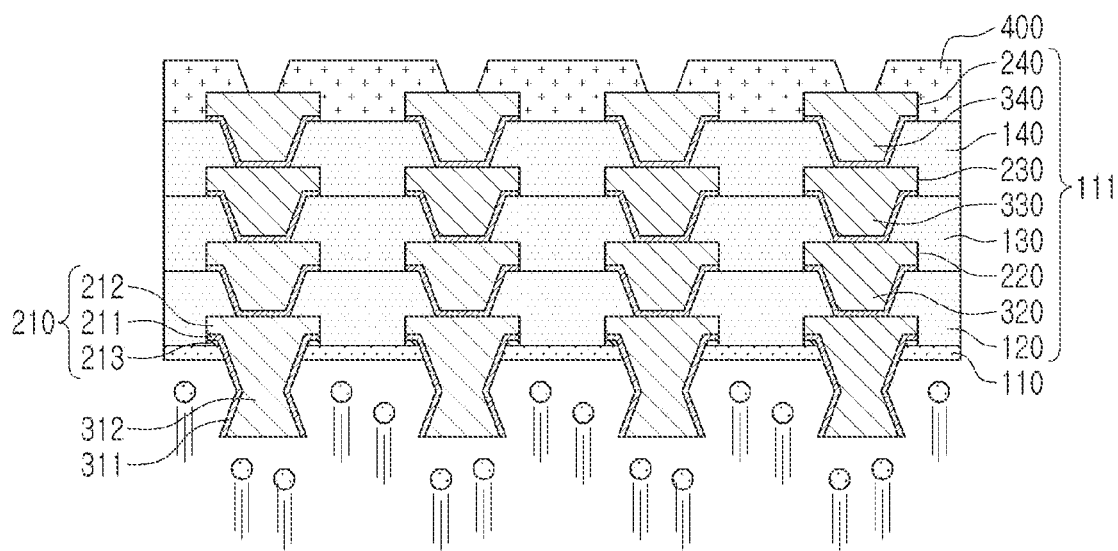

Thereafter, referring to FIG. 11, the insulating material 11 may be partially removed through a blasting technique. Blasting may be performed on the other surface of the base substrate 10. Through the blasting, the insulating material 11 including a resin may be removed, and the remaining insulating material 11 may become the first insulating layer 110 of the printed circuit board 100A according to the present disclosure. As the insulating material 11 is removed during blasting, the side surface of the first via layer 310' may be at least partially exposed, and the first via layer 310' protruding from a lower surface of the first insulating layer 110 may become the bump 310. In order to control the blasting described above, the printed circuit board 100A according to the present disclosure may additionally include a stopper layer, but the stopper layer is not an essential component and may be omitted.

The bump 310 may include first and second layers 311 and 312 through the above-described electroless plating and electrolytic plating, and the first layer 311 may surround a side surface of the second layer 312.

Meanwhile, through the blasting, a coarse roughness may be formed on each of the other surface of the first insulating layer 110 and the lower surface of the bump 310. For example, the first insulating layer 110 may have a relatively coarser roughness on the other surface than on one surface, and the bump 310 may also have a relatively coarser roughness on the lower surface than on the side surface.

In addition, the bump 310 protruding through the blasting may be divided into a first portion 310-1 and a second portion 310-2 based on a transverse section on which the bump 310 has a minimum width. The first portion 310-1 may refer to one of the divided portions relatively close to the first insulating layer 110. In this case, the first portion 310-1 may have a greater thickness or height than the second portion 310-2. As a result, the bump 310 protruding from the other surface of the first insulating layer 110 may have an asymmetric structure with respect to the transverse section on which the bump 310 has a minimum width.

Through the above-described process of manufacturing the printed circuit board 100A, according to the present disclosure, the height of the bump 310 can be controlled by adjusting the thickness of the base substrate 10. Furthermore, separate soldering or bumping can be omitted, resulting in an advantageous effect in that the process can be simplified and productivity can be improved. In addition, it is possible to prevent, in advance, a solder resist non-development defect caused by opening the solder resist in fine units and a solder resist misregistration defect.

Figure 12:
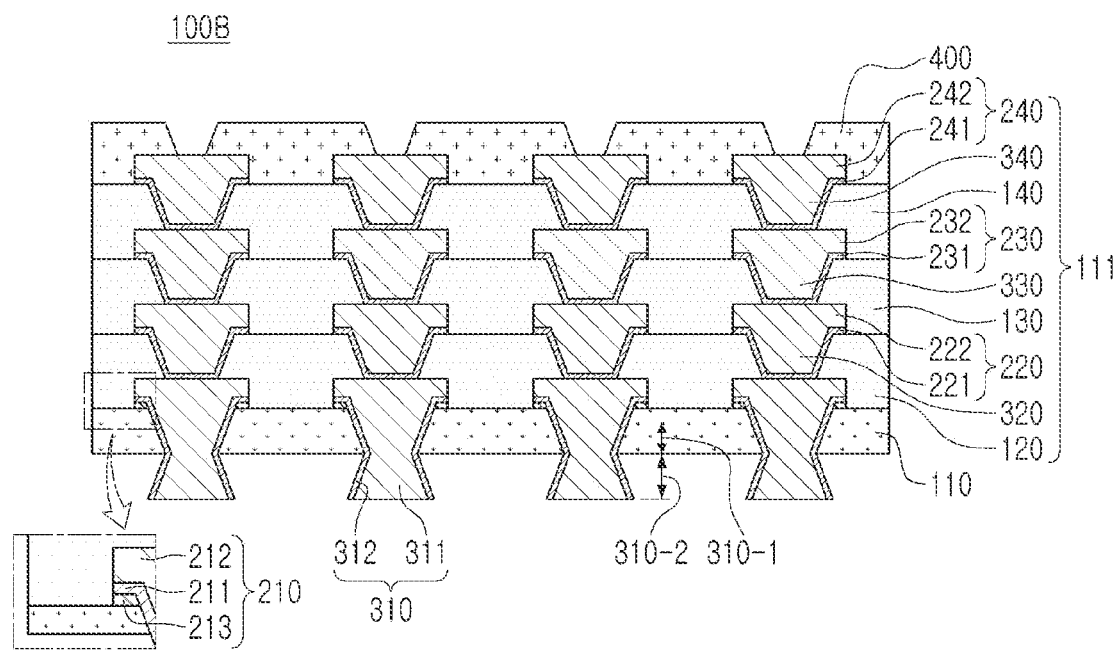
FIG. 12 is a cross-sectional view schematically illustrating another exemplary embodiment of a printed circuit board.

FIG. 12 is a cross-sectional view schematically illustrating another exemplary embodiment of a printed circuit board.

A structure of the printed circuit board 100B according to another exemplary embodiment in the present disclosure is illustrated. As compared with the printed circuit board 100A according to an exemplary embodiment described above, the printed circuit board 100B according to another exemplary embodiment may be different in the shape of the bump 310 protruding from the other surface of the first insulating layer 110. Therefore, the printed circuit board 100B according to another exemplary embodiment will be described below focusing on a different structure from the printed circuit board 100A according to an exemplary embodiment. Concerning the overlapping configuration, the description of the printed circuit board 100A according to an exemplary embodiment may be identically applied to that of the printed circuit board 100B according to another exemplary embodiment.

Referring to FIG. 12, in the printed circuit board 100B according to another exemplary embodiment, the bump 310 protruding from the other surface of the first insulating layer 110 may have a tapered shape. Thus, even if the bump 310 has an asymmetrical hourglass shape as a whole, a portion protruding from the other surface of the first insulating layer 110 may be tapered such that a width thereof gradually decreases in one direction.

The structure of the printed circuit board 100B according to another exemplary embodiment of FIG. 12 may be achieved by controlling the blasting applied to the printed circuit board 100A according to an exemplary embodiment. In order to control the blasting described above, the printed circuit board 100B according to the present disclosure may additionally include a stopper layer, but the stopper layer is not an essential component and may be omitted.

As set forth above, according to the exemplary embodiments in the present disclosure, the printed circuit board on which the electrical connection metal in the form of the metal bump is disposed can be provided.

Further, the printed circuit board including the metal bump partially buried in the insulating layer and partially protruding from the insulating layer can be provided.

In addition, the printed circuit board including the metal bump including the plurality of plating layers can be provided.

While exemplary embodiments have been shown and described above, it will be apparent to those skilled in the art that modifications and variations could be made without departing from the scope of the present invention as defined by the appended claims.

What is claimed is:

1. A printed circuit board comprising:
a first insulating layer;
a first wiring layer disposed on one surface of the first insulating layer; and
a bump extending from the first wiring layer and including an embedded portion disposed in the first insulating layer,
wherein the bump includes a protrusion portion connected to the embedded portion and protruding from the other surface of the first insulating layer, opposite to the one surface of the first insulating layer,
a width of the bump, from one end of the bump contacting the first wiring layer to another end of the bump opposing the one end, decreases and then increases,
the protrusion of the bump includes first and second portions based on a transverse section on which the bump has a smallest width, and
the first portion is disposed between the embedded portion and the second portion and has a smaller thickness than the second portion.

2. The printed circuit board of claim 1, wherein the first wiring layer and the bump are integral.

3. The printed circuit board of claim 1, wherein the bump has a relatively coarser roughness on a lower surface than on a side surface.

4. The printed circuit board of claim 1, further comprising a build-up structure disposed on the one surface of the first insulating layer and including a plurality of build-up insulating layers, a plurality of build-up wiring layers, and a plurality of build-up via layers.

5. The printed circuit board of claim 4, further comprising a solder resist layer disposed on the build-up structure.

* * * * *